US008785815B2

(12) United States Patent  (10) Patent No.: US 8,785,815 B2
Sade et al.  (45) Date of Patent: Jul. 22, 2014

(54) APERTURE CONTROL OF THERMAL PROCESSING RADIATION

(75) Inventors: Amikam Sade, Cupertino, CA (US); Stephen Moffatt, St. Brelade, NJ (US); Bruce E. Adams, Portland, OR (US)

(73) Assignee: Applied Materials, Inc., Santa Clara, CA (US)

( * ) Notice: Subject to any disclaimer, the term of this patent is extended or adjusted under 35 U.S.C. 154(b) by 126 days.

(21) Appl. No.: 13/558,267

(22) Filed: Jul. 25, 2012

(65) Prior Publication Data

US 2013/0340495 A1 Dec. 26, 2013

Related U.S. Application Data

(60) Provisional application No. 61/663,350, filed on Jun. 22, 2012.

(51) Int. Cl.
*H01L 21/26* (2006.01)
*H01L 21/67* (2006.01)
*B23K 26/00* (2014.01)

(52) U.S. Cl.
USPC ............ 219/121.75; 219/121.73; 219/121.61; 347/256; 347/241

(58) Field of Classification Search
USPC ............ 219/121.73, 121.61, 121.75, 121.63; 347/224, 241, 256, 262
See application file for complete search history.

(56) References Cited

U.S. PATENT DOCUMENTS

| | | |
|---|---|---|
| 6,366,308 B1 | 4/2002 | Hawryluk et al. |
| 7,049,544 B2 | 5/2006 | Landau |
| 7,061,959 B2 | 6/2006 | Partlo et al. |
| 7,519,252 B2 | 4/2009 | Morita et al. |
| 8,118,937 B2 | 2/2012 | Tanabe |
| 8,148,663 B2 | 4/2012 | Adams et al. |
| 2004/0224447 A1 | 11/2004 | Adachi et al. |
| 2008/0135785 A1 | 6/2008 | Takaoka et al. |
| 2009/0032511 A1* | 2/2009 | Adams et al. ............ 219/121.75 |
| 2011/0252386 A1 | 10/2011 | Fujimura et al. |

FOREIGN PATENT DOCUMENTS

| | | |
|---|---|---|
| JP | H06-320292 A | 11/1994 |
| JP | 2009-246061 A | 10/2009 |
| KR | 10-1999-0018375 A | 3/1999 |

OTHER PUBLICATIONS

International Search Report for Application No. PCT/US2013/043401, Completion dated of International Search Report Sep. 5, 2013.

* cited by examiner

*Primary Examiner* — David B Jones
(74) *Attorney, Agent, or Firm* — Patterson & Sheridan, LLP

(57) ABSTRACT

Device for processing a substrate are described herein. Devices can include a radiation source and an aperture positioned to receive radiant energy from the radiation source. The aperture can include one or more members, and one or more interfering areas, wherein the interfering areas surround a transmissive area. The one or more structures can affect transmission of radiant energy through a portion of the transmissive area of the aperture. Structures disposed on the aperture can reduce or redirect transmission to provide for more uniform overall transmission of radiant energy through the aperture.

18 Claims, 4 Drawing Sheets

APERTURE CONTROL OF THERMAL PROCESSING RADIATION

CROSS-REFERENCE TO RELATED APPLICATIONS

This application claims benefit of U.S. Provisional Patent Application Ser. No. 61/663,350 (APPM/17040L), filed Jun. 22, 2012, which is herein incorporated by reference.

BACKGROUND OF THE INVENTION

1. Field of the Invention

Embodiments of the present invention generally relate to an apparatus and method for controlling radiation from an aperture.

2. Description of the Related Art

To match the constant demand for smaller and more powerful devices, the size of integrated components on semiconductors has decreased. As features on semiconductor devices become smaller, higher resolution is needed for light used in processes such as photolithography and thermal processing. Radiation uniformity and control are critical capabilities of any photolithography or radiation thermal processing system used for semiconductor applications.

Advanced anneal devices use apertures to process one field at a time. The aperture is imaged on the wafer and only the transmissive area of the aperture is processed. Instead of processing the full field, one can mask or block some areas where process is not needed or desired.

As light comes in contact with an obstacle, such as the edge of an aperture or the edge of a lithographic mask, the light can be diffracted by the obstacle. The diffraction of the light can create edges, round corners or other effects in the exposed photoresist or annealed section which did not exist in the design of the aperture or mask.

Optical Proximity Correction (OPC) has been used to accommodate for the expected distortions of the light created by known obstacles in photolithography. This may be driven by pre-computed look-up tables based on width and spacing between features (rule based OPC) or by using compact models to dynamically simulate the final pattern and thereby drive the movement of edges, typically broken into sections, to find the best solution (model based OPC).

As features become more compact, radiation uniformity and control in optical thermal processing must be increased to accommodate. Current systems are able to achieve non-uniformity of approximately 3%. However, further improvement is needed as demands on manufacturing capabilities continue to increase.

Thus, there is a need in the art for methods and apparatus which allow for increased non-uniformity and thereby increased throughput in optics based semiconductor processing.

SUMMARY OF THE INVENTION

In one embodiment, a device for processing a substrate can include a thermal annealing radiation source, and an aperture positioned to receive radiant energy from the thermal annealing radiation source. The aperture can include at least one transmissive member, and an energy blocking member. The energy blocking member can include an interfering area, wherein the interfering area defines a transmissive area through the transmissive members. Further, the device can include at least one structure affecting transmission of radiant energy through a portion of the transmissive area of the aperture.

In another embodiment, a device for processing a substrate can include a thermal annealing radiation source which provides radiant energy, and an aperture positioned to receive radiant energy from the thermal annealing radiation source. The aperture can include at least one transmissive member, one or more first structures comprising an interfering area formed on or in the transmissive member, and a transmissive area. The transmissive area, in this embodiment, is defined by the first structures. The device can also include one or more second structures which are disposed in at least a portion of the transmissive area of the aperture.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1A:
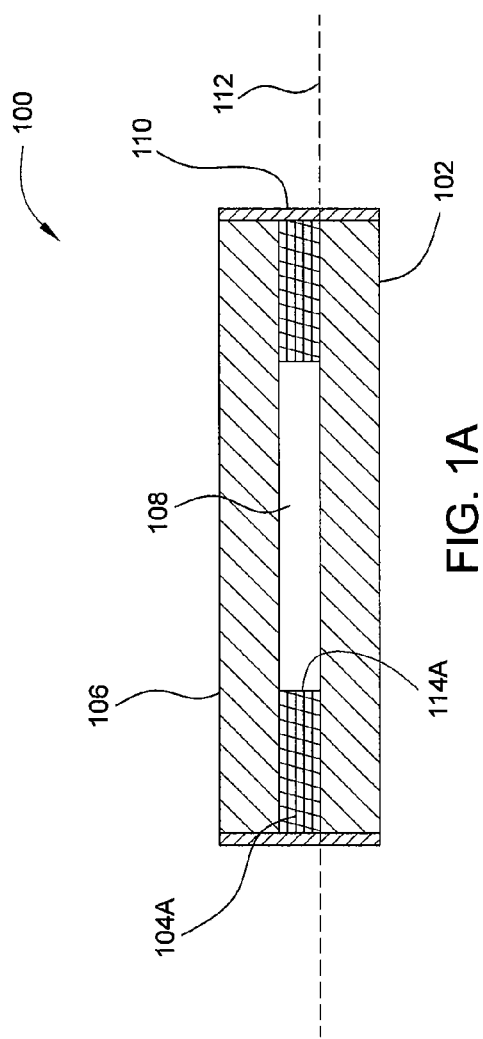
FIGS. 1A and 1B illustrate a side view of an aperture according to one or more embodiments.

A device disclosed herein for thermally processing a substrate includes a radiation source that provides radiant energy, and an aperture positioned to receive radiant energy from the radiation source, the aperture having one or more structures affecting transmission of radiant energy through a portion of the transmissive area of the aperture. The aperture can include one or more members, and one or more interfering areas, wherein the interfering areas surround a transmissive area. The interfering areas can comprise an energy blocking area. The aperture generally forms the radiant energy into a desired shape and directs a shaped radiation field toward the substrate.

The structures can include a partially transmissive coating that can be disposed over either a portion of, or the entirety of, the transmissive area. The structures, which can include convexities, concavities, and coatings, can be disposed in at least a portion of the transmissive areas of the aperture. The members of the aperture may be energy blocking members, at least one of which can comprise an interfering area and/or a transmissive area, or transmissive members that can converge or diverge the radiant energy. The convexities and concavities can have a dimension that is less than the wavelength of the radiant energy to avoid forming unwanted images in the radiation field that emerges from the aperture. At least one of the structures can direct radiant energy toward a desired annealing area of a substrate.

One of the structures can be an extremity shaping structure or an intensity correcting structure, which can include convexities, concavities or a combination thereof formed on or in one of the members of the aperture. Convexities can include lines, dots, or other shapes which are deposited or etched on top of the transmissive member. Concavities can include lines, dots, or other shapes which are deposited or etched into the transmissive member. The extremity shaping structure or the intensity correcting structure can also include a partially transmissive coating formed on or in the aperture or one of the members.

Coatings on any portion of the aperture can be a reflective coating, an opaque coating, a partially transmissive coating, a partially reflective coating, or combinations thereof. Such coatings are typically selected to make the intensity of the radiant energy reaching the substrate more uniform by removing or reducing non-uniformities in the radiant energy emitted by the radiation source. In one embodiment, the aperture can converge or diverge radiant energy.

The convexities or concavities can be formed on the aperture or a member thereof by a lithographic process, such as photolithography. The convexities or concavities on any portion of the aperture can be reflective, opaque, partially transmissive, partially reflective, or combinations thereof. The convexities or concavities can be positioned so as to direct radiant energy toward one or more portions of a desired annealing area of a substrate. In one or more embodiments, the structures of the aperture or member can be lines. In another embodiment, the structures can have a dimension which is less than the wavelength of the radiant energy. Embodiments of the present application can be better understood with reference to the figures below.

FIG. 1A illustrates a side view of an aperture 100 according to one embodiment. The aperture 100 can have a first member 102 that is substantially transparent to selected forms of energy, such as light or laser radiation having a selected wavelength. An energy blocking member 104A, which may be opaque, partially transmissive or reflective, can be formed over a portion of a surface of the first member 102 defining an opening 108 through which energy will pass in the shape of the opening 108. A second member 106 can be disposed over the first member 102 and the energy blocking member 104, covering the opening 108. The second member 106 can also be substantially transparent to the energy to be transmitted through the aperture 100, and may be the same material as the first member 102. The edges of the aperture 100 are enclosed by a covering 110 that ensures particulates do not enter the opening 108.

The aperture 100 can be positioned such that the energy blocking member 104 is at a focal plane 112 of the energy incident on the aperture 100, ensuring a precise truncation of the energy field. Because the opening 108 is positioned at the focal plane of the energy, any particles that collect in the opening, for example on the surface of the first member 102, cast shadows in the transmitted energy field that lead to non-uniform processing of a substrate. Covering the opening 108 with the second member 106 and enclosing the edges of the aperture 100 ensures that any particles adhering to the aperture 100 are far enough from the focal plane to be out of focus in the final energy field so that variation in intensity of the final energy field due to the shadows of the particles is reduced.

The first and second members 102 and 106 are typically made from the same material, such as glass or quartz. The energy blocking member 104A may be an opaque, partially transmissive or reflective material, such as metal, white paint, or a dielectric mirror. The energy blocking member 104A may be formed and/or shaped. The energy blocking member 104A can be applied to the first member 102 using an appropriate adhesive, such as Canada balsam. Alternately, the energy blocking member 104A may be deposited or grown on the first member 102 in a vapor application process and then etched to form the opening 108. The second member 106 is typically applied to the energy blocking member 104 using adhesive. However, other connecting means can be used to connect the first member 102 and the second member 106. For example, the second member 106 may also be deposited or grown in a vapor application process.

The covering 110 may be a material that is permeable or impermeable to gases. The covering may be an adhesive or a hard material applied using an adhesive. Alternately, the covering 110 may be formed by melt-fusing the edges of the first and second members 102 and 106 with the edge of the energy blocking member 104A.

To avoid refractive effects of the aperture 100, the side walls of the opening 108, defined by an interior edge 114A of the energy blocking member 104A, may be tapered, angled, slanted, or otherwise shaped to minimize refractive effects, for example by matching the propagation direction of radiant energy emerging from the thermal annealing radiation source.

Figure 1B:
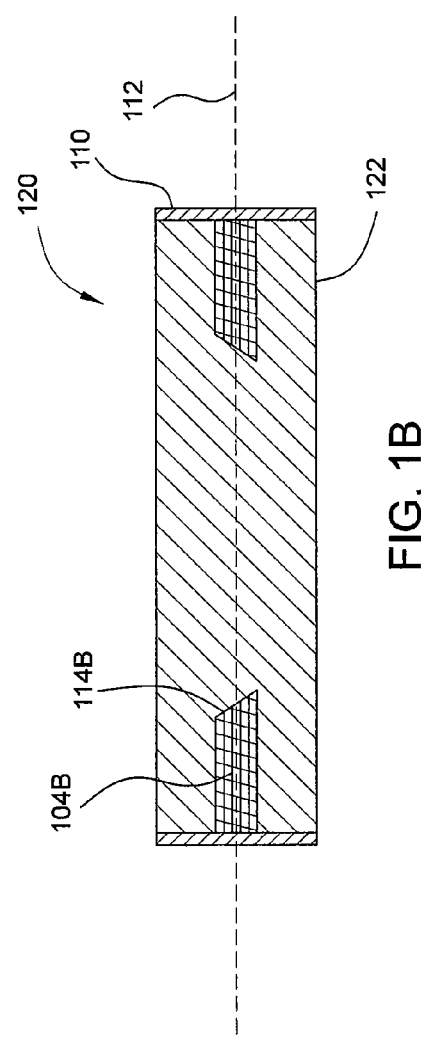

FIG. 1B is a side view of an aperture 120 according to another embodiment. The aperture 120 is similar to the aperture 100 of FIG. 1A, except that the aperture 120 has no central opening 108. The aperture 120 comprises a transmissive member 122 with the energy blocking member 104 embedded therein. Reducing the number of interfaces between different media in the aperture 120 may reduce refractive effects. The interior edge 114B of the energy blocking member 104B is shown tapered in the embodiment of FIG. 1B, as described above in connection with FIG. 1A.

The aperture 120 of FIG. 1B may be made by etching or grinding an annular shelf around a central dais of a first transmissive member, adhering an annular energy blocking member to the annular shelf, and then adhering a second transmissive member to the energy blocking member and the central dais of the first transmissive member, using an optically inactive adhesive such as Canada balsam. Alternately, the energy blocking member may be adhered to a first transmissive member having no central dais, and the second transmissive member formed by depositing a material over the energy blocking member and the exposed portion of the first transmissive member, filling the central opening with transmissive material. Deposition of transmissive materials is well-known in the art, and may be practiced using any known deposition or coating process.

Apertures may vary in size. A smaller aperture may be positioned proximate a larger aperture to reduce the size of the transmitted energy field. The smaller aperture may be removed again to utilize the larger aperture. Multiple apertures having different sizes may be provided to allow changing the size of the energy field to anneal areas having different sizes. Alternately, a single aperture may have a variable aperture size. Two rectangular channels may be formed in a transparent housing, and two pairs of opaque or reflective actuated half-plates disposed in the rectangular channels such that a pair of half-plates meets in a central portion of the transparent housing. The pairs of half-plates may be oriented to move along orthogonal axes so that a rectangular aperture of variable size may be formed by moving each pair of half-plates closer together or further apart within the rectangular channels.

The apertures 100 and 120 may magnify or reduce the image of the light passing through the aperture in any desired way. The apertures may have magnification factor of 1:1, which is essentially no magnification, or may reduce the image in size by a factor of between about 1.1:1 and about 5:1, for example, about 2:1 or about 4:1. Reduction in size may be useful for some embodiments because the edges of the imaged energy field may be sharpened by the size reduction. Magnification by a factor between about 1:1.1 and about 1:5, for example about 1:2, may be useful in some embodiments to improve efficiency and throughput by increasing coverage area of the imaged energy field.

Further embodiments can include the use of the first transmissive member without the second transmissive member or using more than two transmissive members to create alternate embodiments in accordance with the descriptions above. As well, embodiments can use structures, such as convexities, concavities or coatings, in place of the energy blocking member 104.

Figure 2:
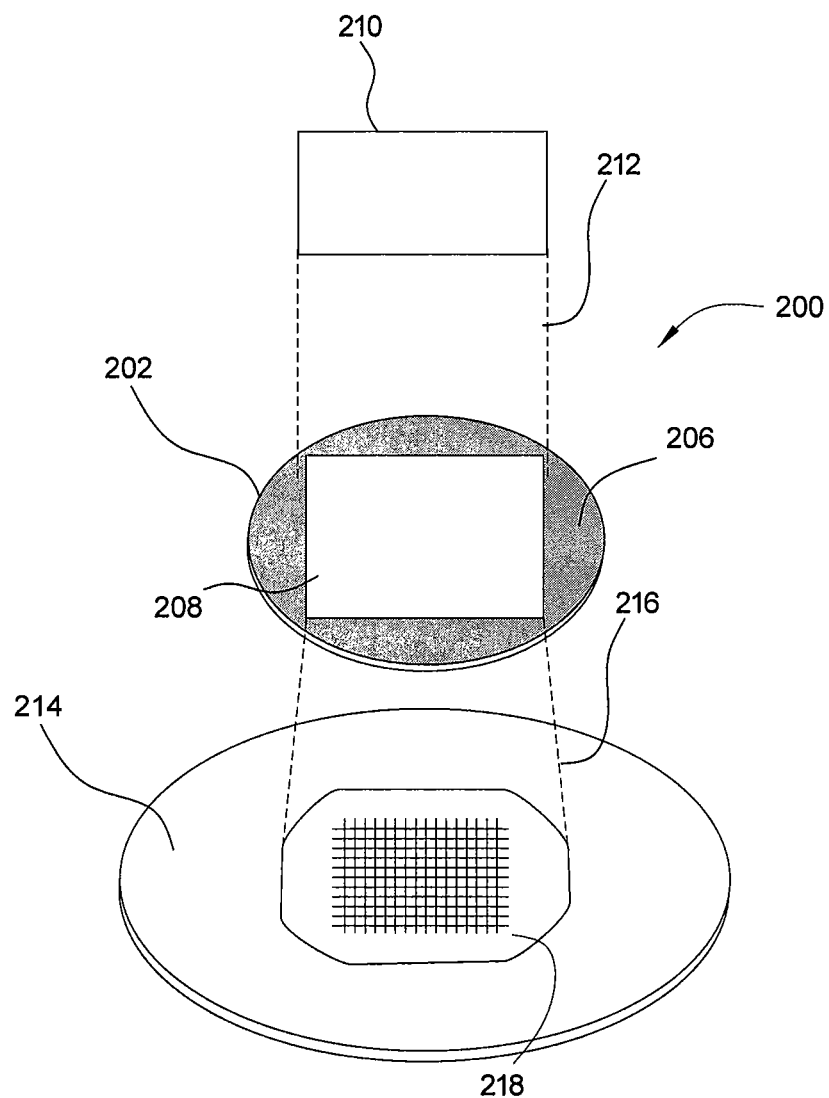
FIG. 2 illustrates an aperture controlling transmission of radiant energy to a substrate.

FIG. 2 illustrates an overhead view of a thermal processing device 200 according to one embodiment. The thermal processing device 200 has an aperture 202 with an interfering area 206 and a transmissive area 208. The interfering area 206 can either reduce or prevent the transmission of radiant energy, similar to the areas or the apertures 100 and 102 that are affected by the energy blocking member 104 or other areas which affect the transmission of radiant energy, for example by use of a non-transmissive layer disposed thereon. The transmissive area 208 transmits radiant energy through the aperture 202, and may including areas that are completely or partially transmissive to radiant energy, such as energy blocking members. Though the transmissive area and the surrounding interfering area are shown as a square shape, embodiments can include all known shapes or groups of shapes, dependant on the needs of the user. Further, some embodiments may not include an interfering area 206.

The thermal processing device 200 has a thermal annealing radiation source 210. The thermal annealing radiation source 210 emits a radiant energy 212, which may be a coherent light, for example a laser beam. The aperture 202 is positioned so as to receive radiant energy 212 from the thermal annealing radiation source 210. The aperture shapes the radiant energy 212 and transmits resulting radiant energy 216 to a substrate 214.

The resulting radiant energy 216 transmitted to the substrate 214 forms an image 218 on the surface of the substrate that is shaped by the transmissive area 208 as affected by diffraction of the radiant energy 212 at the edges of the transmissive area 208. The shape of the image 218 on the substrate 214 may differ from the shape of the transmissive area due to diffraction by the aperture 202. Likewise, the intensity pattern of the resulting radiant energy 216 may also differ from the original intensity pattern of the radiant energy 212 due to diffraction by the aperture 202.

Without intending to be bound by theory, when waves come in contact with an obstacle, those waves can bend around the obstacle. In the case of thermal processing, the radiant energy that passes through the transmissive area is both shaped by the transmissive area and bends around the transmissive area. Optical dead zones can be created at the corners of the image, and the radiant energy can "bow out" at the edges of the image.

Refractive structures can be used to correct for some of the effects of diffraction, such as overshoot effect. By creating shapes in the transmissive area, refractive structures can accommodate for expected optical dead zones and other properties of light at specific wavelengths to better approximate the desired image transmitted to the substrate.

The shape of the radiant energy can be further controlled by forming coatings and convexities or concavities on the transmissive area of the aperture in conjunction with or independent from refractive structures. The structures described herein correct the extremities of the image. FIGS. 3A-3D illustrate alternative embodiments of an aperture member with extremity shaping structures, such as lines, dots and coatings, formed on the transmissive surface. The embodiments disclosed here are not intended to be limiting of all possible embodiments.

Figure 3A:
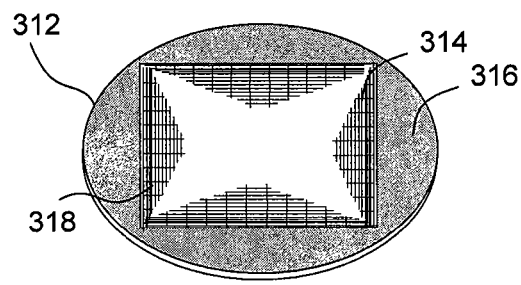
FIGS. 3A-3D illustrate alternative embodiments of an aperture with optical proximity correction.

FIG. 3A illustrates an extremity shaping aperture with one or more lines according to one embodiment. The aperture 312 can have a transmissive area 318, which is the defined in the first and second member by an interfering area 316. The edges of the transmissive area 318 can each have one or more lines 314 which can be in a triangle shape and a grid-like pattern or other patterns. The lines 314 can each have a dimension, for example a width, which is less than the wavelength of the radiant energy selected for the substrate. It is believed that if the dimension of the line is greater than the wavelength of the radiant energy, shadows may be formed on the substrate.

The pitch of the lines can be adjusted to control flux of radiant energy through the transmissive area of the aperture. For example, the pitch between the lines 314 can be less near a boundary of the transmissive area 318 and greater near a central region of the transmissive area 318. The pitch of the lines 314 can be used to decrease the bowing which can occur at the edges of the resulting radiant energy.

Though the lines here are depicted in a grid formation, the lines can be in any formation. The lines can be formed into shapes in some cases, such as a hexagon or a circle. Further, the lines can each have one or more curves. Finally, the lines can each have different dimensions to control transmissivity, for example by using smaller line dimensions in areas where more transmission of the image is desired. Various combinations of the above embodiments can be used to achieve similar results.

Figure 3B:
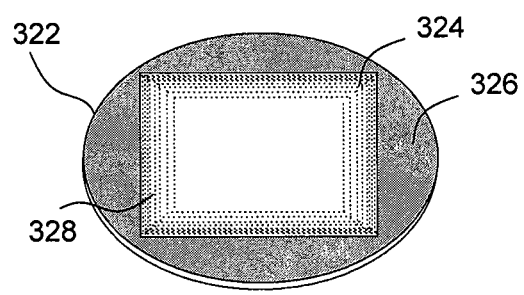

FIG. 3B illustrates an extremity shaping aperture with one or more dots according to one embodiment. The aperture 322 can have a transmissive area 328, which is the defined in the first and second member by an interfering area 326. The edges of the transmissive area 328 can have a doted area 324 which can be in a triangle pattern or other patterns based on where the decrease in radiant energy transmission is desired. The doted area 324 can have dots with a diameter of less than the wavelength of the radiant energy. The pitch of the dots can be widened to allow more radiant energy through the aperture. For example, the pitch of the dots in the doted area 324 can be decreased as the doted area 324 approaches the boundary of the transmissive area 328. As above, both positioning of the dots, transmission of the dots, and pitch of the dots may be used to control both dead zones and bowing. Further, the pitch of the dots need not remain uniform in comparison to one another. The dots need not be circular in shape and may be ovals, squares or other shapes as is desired. Further the varying dimension, the size of the dots and the pitch of the dots may be used in unison to control overall transmission through the transmissive area 328.

Figure 3C:
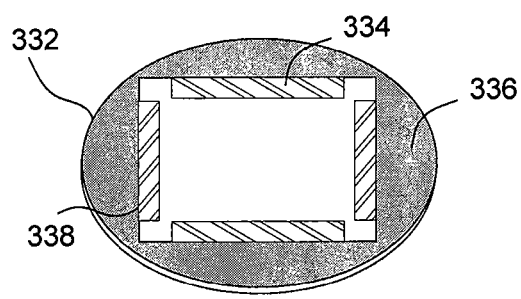

FIG. 3C illustrates an extremity shaping aperture with at least one coated area according to one embodiment. The aperture 332 can have a transmissive area 338, which is the defined in the first and second member by an interfering area 336. The edges of the transmissive area 338 can have a coated area 334 which can be in a square pattern or other patterns based on where the decrease in radiant energy transmission is desired. The transmissivity of the coating to radiant energy may be either uniform or vary based on the needs of the user, such as a coating that is highly transmissive near areas where dead zones are expected with increasing opacity near areas of bowing.

More than one area may be coated. The coated area 334 can be deposited by known techniques, such as chemical vapor deposition (CVD) or physical vapor deposition (PVD). The coated area 334 may be either reflective or opaque or a combination thereof, such as an amorphous carbon layer. The coated area 334 may also be etched so as to further define edges or to create protected zones in the resulting radiant energy.

Convexities, concavities and coatings that are used in the embodiments described herein may be formed by an etching process, a deposition process or combinations thereof. Etching processes can include a lithographic process, for example photolithography. Deposition processes can include CVD or PVD, such as a plasma enhanced CVD process. Convexities, concavities and coatings that are deposited can be composed of either reflective, partially transmissive or opaque material. The types of processes for forming concavities and convexities listed above are not intended to be limiting. It is envisioned that any process which creates a structure that reduces, blocks or redirects the transmission of light through a transmissive area of a transmissive member can be employed in accordance with embodiments described herein.

Convexities, concavities or coatings can be used to reduce, block or redirect transmission. Redirecting transmission, which can be done using lens-like features, can be important for restoring uniformity. When two waves with the same frequency combine, the resulting pattern is determined by the phase difference between the two waves. Waves that are in phase will undergo constructive interference while waves that are out of phase will undergo destructive interference. Since the waves that are being redirected can travel a slightly longer path than the waves that are not redirected, the redirected waves can be used to enhance or interfere with other portions of the radiant energy. This effect can be used to create controlled dead zones that can be used to manipulate the shape of the resulting radiant energy.

With consideration of an aperture with more than one member, convexities, concavities or coatings can be formed on any surface of any member of the aperture that would affect the transmission in the transmissive area. Further, convexities, concavities or coatings can be formed on more than one surface where they can act in conjunction or separately to affect the radiant energy. Convexities, concavities and coatings can also be formed on the same surface, including the same area of the same surface, where they can affect the radiant energy transmitted through the aperture.

Figure 3D:
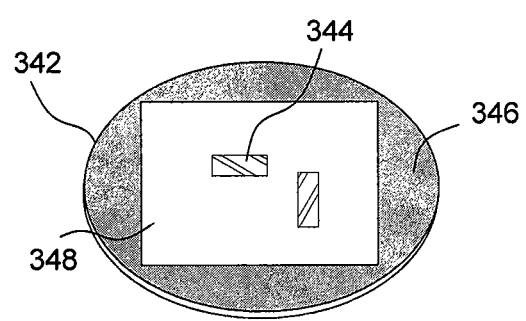

FIG. 3D illustrates an extremity shaping aperture with one or more ablated areas according to one or more embodiments. The aperture 342 can have a transmissive area 348, which is the defined in the first and second member by an interfering area 346. The edges of the transmissive area 348 can have one or more ablated areas 344, which can be in a square pattern or other patterns based on the position and shape of the decrease in radiant energy transmission that is desired. The ablated areas 344 can be a solid coating, a partially transmissive coating, an etched design, dots or lines as described above, or any combination thereof. The radiant energy can be reduced or completely blocked in the described area, thus protecting a component or area of the substrate. Extremity shaping structures described above can be used to correct for refraction at the edges of the ablated areas 344, such as lines at the edge of the transmissive area to correct for overshoot effects.

The convexities, concavities and coatings described above can be used to shape the radiant energy to match the area to be affected. Extremity shaping structures can be created using the convexities, the concavities, the coating, and the energy blocking member or a combination thereof. As well, the convexities, concavities and coatings may be used to provide a more uniform intensity in the resulting radiant energy.

The intensity of the radiant energy can be further controlled by forming intensity correcting structures on the transmissive area of the aperture in conjunction with or independent from the extremity shaping structures described above. FIGS. 4A-4D illustrate alternative embodiments of an aperture member with intensity correcting structures, such as lines, dots and coatings, formed on the transmissive surface. The embodiments disclosed here are not intended to be limiting of all possible embodiments.

Figure 4A:
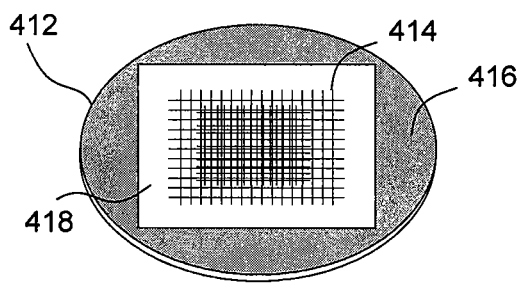
FIGS. 4A-4D illustrate alternative embodiments of an aperture with intensity correction.

FIG. 4A depicts a top view of an intensity correcting aperture with one or more lines. The aperture 412 can have a transmissive area 418, which is the defined in the first and second member by an interfering area 416. The center of the transmissive area 418 can have one or more lines 414, which can be in a circular formation using a grid like pattern. Other shapes and patterns can be used based on the location and intensity of the decrease in radiant energy transmission, as may be desired. The lines 414, as described above, can be etched into one or more members, disposed on or into the members or combinations thereof. The lines 414 described here may include variants described earlier, such as changing the dimension of the lines, changing the pitch between lines or changing the shape of the lines to control the overall transmission through the transmissive area 418 of the aperture 412.

In this embodiment, the lines can be formed as a circular structure with a grid like pattern where the lines have smaller dimensions and a larger pitch between lines as they become more distant from the center, creating a central area that is less transmissive and outer areas that are progressively more transmissive. This embodiment is designed to reduce transmission in the area where transmission is expected to be less affected by refraction, so as to make the intensity at the edges more uniform with the intensity at the center. Other convexities, concavities, coatings, or other factors may affect the intensity of the resulting radiant energy as it corresponds to the transmissive area 418. As such, the lines 414 need not be centrally located nor have a different transmissivity between portions of the intensity correcting area.

Figure 4B:
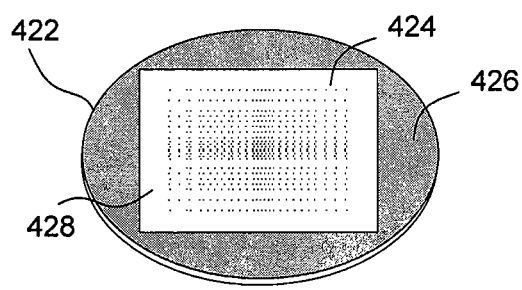

FIG. 4B depicts a top view of an intensity correcting aperture with one or more dots. The aperture 422 can have a transmissive area 428, which is the defined in the first and second member by an interfering area 426. The center of the transmissive area 428 can have one or more dots 424, which can be in a circular formation with increasing distance between the dots. Other shapes and patterns can be used based on the location and intensity of the decrease in radiant energy transmission, as may be desired. The one or more dots 424, as described above, can be etched into one or more members, disposed on or into one or more members or combinations thereof. The one or more dots 424 described here may include variants described earlier, such as changing the dimension of the dot, changing the spacing between dots, changing the transmissivity of the dots or changing the shape of the dot to control the overall transmission of radiant energy through the transmissive area 428 of the aperture 422.

In this embodiment, the dots can be formed as a circular structure with expanding space between the dots, and thereby fewer dots, as they become more distant from the center. This embodiment can create a central area that is less transmissive and outer areas that are progressively more transmissive. This embodiment is designed to reduce transmission in the area where transmission is expected to be less affected by refraction, so as to make the intensity at the edges more uniform with the intensity at the center. Other convexities, concavities, coatings, or other factors may affect the intensity of the resulting radiant energy as it corresponds to the transmissive area 428. As such, the one or more dots 424 need not be centrally located nor have a different transmissivity between portions of the intensity correcting area.

Figure 4C:
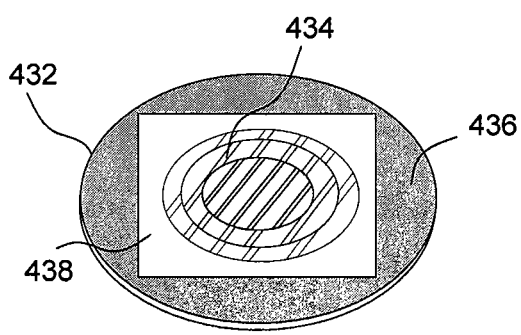

FIG. 4C depicts a top view of an intensity correcting aperture with the coated area 434. The aperture 432 can have a transmissive area 438, which is the defined in the first and second member by an interfering area 436. The center of the transmissive area 438 can have a coated area 434, which can be in a circular pattern or other patterns based on where the decrease in radiant energy transmission is desired. The coated area 434, as described above, can comprise a partially transmissive coating. As well, the coating may be either reflective or opaque. Further embodiments may include combining both reflective and opaque coatings dependant on the needs of the user.

In this embodiment, the coated area can be formed as a ring-like structure or a gradient-like structure, with a central area that is less transmissive and outer rings or areas that are progressively more transmissive. This embodiment is designed to reduce transmission in the area where transmission is expected to be less affected by refraction, so as to make the intensity at the edges more uniform with the intensity at the center. Other convexities, concavities, coatings, or other factors may affect the intensity of the resulting radiant energy as it corresponds to the transmissive area. As such, the coated area need not be centrally located nor have a different transmissivity between portions of the intensity correcting area. Further, though boundaries are discernible in the ring-like structure shown in this embodiment, further embodiments can include a gradient or ring structure with no discernible boundaries.

Figure 4D:
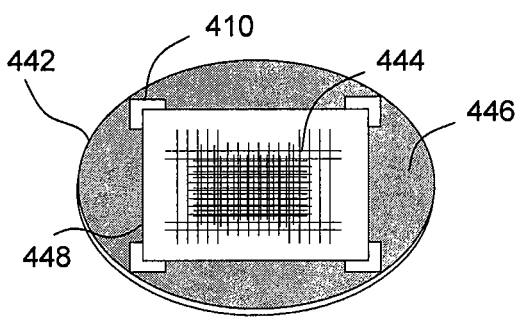

FIG. 4D depicts a top view of an intensity correcting aperture with shapes 410 and one or more lines 444 formed in the transmissive area. The aperture 442 can have a transmissive area 448, which is the defined in the first and second member by an interfering area 416. The transmissive area can have one or more shapes 410 formed in the shaped interfering area 446. The center of the transmissive area 448 can have one or more lines 444, which can be in a four pointed star shaped pattern or other patterns based on where the decrease in radiant energy transmission is desired. The lines 444 described in this embodiment can be used to correct the intensity of the beam that has been altered by the one or more shapes 410 to have a resulting radiant energy that produces a more square shaped image on the substrate. Though this embodiment is described as using lines, any type of convexity, concavity or coating may be used, either alone or in some combination thereof to alter the intensity of the radiant energy and produce a more uniform resulting radiant energy.

The embodiments described above may also be used in combination with members that converge or diverge radiant energy, such as a lens. The members can converge or diverge radiant energy in one or more areas of the member or over the entire member. The convergence or divergence of radiant energy may be altered by overall shape of the member, shape at specific portions of the member or a combination thereof. Further, convergent and divergent portions can be combined in one or more embodiments to form a member that both converges and diverges radiant energy.

The convexities, concavities or coatings described with reference to either intensity correcting apertures or extremity shaping apertures may be used in any combination so as to create both uniform edges and uniform intensity of the resulting radiant energy that is transmitted to the substrate. Specific embodiments are not intended to be limiting of the scope of possible embodiments disclosed in this application.

Embodiments described herein relate to an apparatus for controlling radiation flowing through an aperture. Controlling radiation is intended to include both the shape of the radiation and the intensity of the field as transmitted to the substrate. By providing lines or dots in the formations as described above, both the shape and the intensity of the resulting radiant energy may be controlled. The embodiments described herein may be used in conjunction with one another or alone. By using combinations of either intensity correcting or extremity shaping structures on an aperture, the image from the radiant energy can more uniformly affect the substrate and over a shorter period of time.

While the foregoing is directed to embodiments of the present invention, other and further embodiments of the invention may be devised without departing from the basic scope thereof, and the scope thereof is determined by the claims that follow.

The invention claimed is:

1. A device for processing a substrate comprising:
 a thermal annealing radiation source;
 an aperture positioned to receive radiant energy from the thermal annealing radiation source, the aperture comprising:
  one or more transmissive members; and
  an energy blocking member, wherein the energy blocking member creates an interfering area, and wherein the interfering area defines a transmissive area through the one or more transmissive members; and
 a structure affecting transmission of radiant energy through a portion of the transmissive area of the transmissive member, wherein the structure affecting transmission of radiant energy is not uniform across the transmissive member.

2. The device of claim 1, wherein the structure is a partially transmissive coating.

3. The device of claim 2, wherein the partially transmissive coating is disposed over the entirety of the transmissive area.

4. The device of claim 1, wherein the structure is an extremity shaping structure.

5. The device of claim 4, wherein the extremity shaping structure comprises convexities, concavities or a combination thereof formed on or in the one or more transmissive members.

6. The device of claim 4, wherein the extremity shaping structure comprises a partially transmissive coating formed on or in at least one of the one or more transmissive members.

7. The device of claim 1, wherein the structure is an intensity correcting structure.

8. The device of claim 7, wherein the intensity correcting structure comprises a coating formed on or in at least one of the one or more transmissive members.

9. A device for processing a substrate comprising:
 a thermal annealing radiation source which provides radiant energy;
 an aperture positioned to receive radiant energy from the thermal annealing radiation source, the aperture comprising:
  one or more transmissive members;

one or more first structures comprising an interfering area formed on or in at least one of the one or more transmissive members; and a transmissive area, wherein the transmissive area is defined by the first structures and comprises at least a first area and a second area; and one or more second structures disposed on or in at least a portion of the transmissive area of the transmissive member, wherein the one or more second structures alter transmission of radiant energy in the first area to a greater extent than the second area.

10. The device of claim 9, wherein the one or more transmissive members comprise at least two transmissive members, and wherein the first structures are disposed on or in more than one of the one or more transmissive members.

11. The device of claim 9, wherein the second structures comprise an extremity shaping structure.

12. The device of claim 11, wherein the extremity shaping structures comprise convexities, concavities or a combination thereof formed on or in at least one of the one or more transmissive members.

13. The device of claim 11, wherein the extremity shaping structures comprise a partially transmissive coating formed on or in at least one of the one or more transmissive members.

14. A device for processing a substrate comprising:
a thermal annealing radiation source which provides radiant energy;
an aperture positioned to receive radiant energy from the thermal annealing radiation source, the aperture comprising:
at least one transmissive member;
one or more first structures comprising an interfering area formed on or in each transmissive member; and
a transmissive area, wherein the transmissive area is defined by the first structures; and
one or more second structures disposed in at least a portion of the transmissive area of the aperture, wherein the second structures have a dimension which is less than the wavelength of the radiant energy or wherein the second structures comprise an intensity correcting structure.

15. The device of claim 14, wherein the intensity correcting structures comprise convexities, concavities or a combination thereof formed on or in each transmissive member.

16. The device of claim 14, wherein the intensity correcting structures comprise a coating formed on or in each transmissive member.

17. A device for processing a substrate comprising:
a thermal annealing radiation source which provides radiant energy;
an aperture positioned to receive radiant energy from the thermal annealing radiation source, the aperture comprising:
one or more transmissive members;
one or more first structures comprising an interfering area formed on or in at least one of the one or more transmissive members; and
a transmissive area, wherein the transmissive area is defined by the first structures and comprises at least a first area and a second area; and
one or more second structures disposed on or in at least a portion of the transmissive area of the transmissive member, wherein the second structures comprise an extremity shaping structure or an intensity correcting structure, and wherein the extremity shaping structure or the intensity correcting structure comprises convexities, concavities or a combination thereof formed on or in the one or more transmissive members.

18. A device for processing a substrate comprising:
a thermal annealing radiation source;
an aperture positioned to receive radiant energy from the thermal annealing radiation source, the aperture comprising:
at least one transmissive member; and
an energy blocking member, wherein the energy blocking member comprises an interfering area, and wherein the interfering area defines a transmissive area through each transmissive member; and
at least one structure affecting transmission of radiant energy through a portion of the transmissive area of the aperture, wherein 1) the energy blocking member is tapered or 2) wherein the structure is an intensity correcting structure that comprises convexities, concavities, or a combination thereof formed on or in each transmissive member.

* * * * *

UNITED STATES PATENT AND TRADEMARK OFFICE
CERTIFICATE OF CORRECTION

PATENT NO.         : 8,785,815 B2                              Page 1 of 1
APPLICATION NO.    : 13/558267
DATED              : July 22, 2014
INVENTOR(S)        : Sade et al.

It is certified that error appears in the above-identified patent and that said Letters Patent is hereby corrected as shown below:

Title Page, Inventors item (75) line 2:

Please delete "St. Brelade, NJ (US)" and insert --St. Brelade (JE)-- therefor.

Signed and Sealed this
Eleventh Day of November, 2014

Michelle K. Lee
*Deputy Director of the United States Patent and Trademark Office*